United States Patent [19]

Farina

[11] 4,118,657
[45] Oct. 3, 1978

[54] CIRCUIT ARRANGEMENT FOR PROVIDING A SAW-TOOTH CURRENT IN A COIL

[76] Inventor: Attilio Farina, Via Ventimiglia 162, 10100 Torino, Italy

[21] Appl. No.: 770,115

[22] Filed: Feb. 18, 1977

[30] Foreign Application Priority Data

Apr. 7, 1976 [IT] Italy .................. 67804 A/76

[51] Int. Cl.² .................. H01J 29/70; H01J 29/76
[52] U.S. Cl. .................. 315/408; 315/399
[58] Field of Search .................. 315/399, 408, 410, 411

[56] References Cited

U.S. PATENT DOCUMENTS

| | | | |
|---|---|---|---|
| 3,195,009 | 6/1965 | Poorter | 315/408 |
| 3,638,067 | 1/1972 | Dietz | 315/408 |
| 3,889,156 | 6/1975 | Arya | 315/408 |

Primary Examiner—Richard A. Farley
Assistant Examiner—T. M. Blum

Attorney, Agent, or Firm—Allison C. Collard; Thomas M. Galgano; Tab T. Thein

[57] ABSTRACT

In a circuit arrangement for providing a periodic saw-tooth current in a coil, e.g. a kinescope deflector coil, comprising a one-way conducting device that connects the coil to a voltage source, and a controllable switching device having a control electrode connectable to a periodic pilot-pulse source that makes the switching device conductive during part of the saw-tooth cycle, the switching device being connectable to a current source through an induction coil, including a capacitor that is charged by the current source by means of the induction coil when the switching device is not conductive, the improvement wherein the capacitor is connected to the primary winding of a transformer, the secondary winding of the latter being connected to the one-way conducting device, and wherein the time during which the switching device conducts and the capacitor discharges are longer than the return time of the saw-tooth cycle.

3 Claims, 1 Drawing Figure

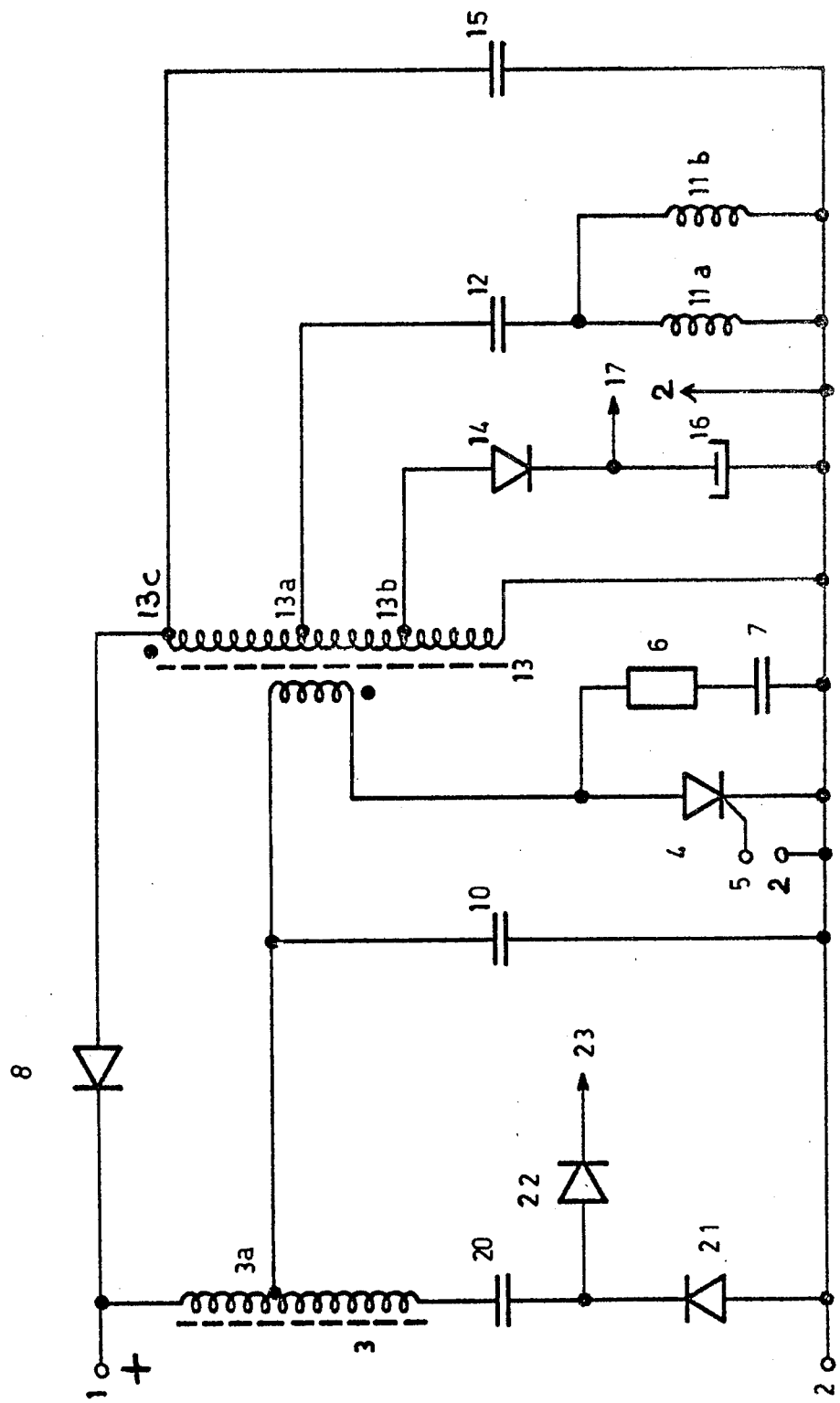

CIRCUIT ARRANGEMENT FOR PROVIDING A SAW-TOOTH CURRENT IN A COIL

The present invention relates to a circuit arrangement designed to provide a periodic saw-tooth current in a coil, particularly a kinescope deflector coil. In basic aspects of such arrangements, there is a one-way conducting device connecting the coil to a voltage source, and a controllable switching device, with its control electrode connected to a periodic pilot-pulse source that makes the switch conductive during part of the saw-tooth cycle, connectable to a current spply by means of an inductance. A capacitor may be included that is being charged when the switching device is not conductive. A number of semiconductor arrangements similar to the one described are already known.

The first arrangement of its type to be known which made use of a thyristor and a diode was that described in an article by S. A. Schwartz and L. L. Ornik in the IEEE Transactions on BTR, November 1963, No. 3, pages 9 to 22. This arrangement has a number of drawbacks so much so that it has not been put into practical use.

For example, the conduction time of the thyristor is very short, with the result that the current peak is very high. In addition it is very difficult to obtain an extra-high voltage for the kinescope anode when using this circuit without producing unwanted oscillations in the deflection current.

One solution for overcoming the latter drawback was suggested by L. Szanto ("A Retrace Driven Television Horizontal Deflection Circuit", IEEE Transactions on BTR, April 1966, pp. 51 to 64). However, as was explained in the above article, this solution is very difficult to put into practice, the reason being that the optimum capacity and leakage inductance values calculated for tuning the extra-high-voltage transformer are practically unobtainable. If the transistor is tuned using different values, such as those normally obtainable in practice, excessive internal resistance is encountered at the extra-high-voltage generator.

Other thyristor circuits proposed later (for example, the one disclosed in Italian Pat. No. 812,759 and perfected by Italian Pat. Nos. 867,583, 901,666 and others) are decidedly more complex. A simple, reliable thyristor circuit is not yet available for a large-screen black-and-white television set, for example.

The object of the present invention is to provide a thyristor circuit arrangement for the horizontal delfection and supply of auxiliary television circuits, overcoming the inconveniences described above.

With this object in view, the present invention relates to a circuit arrangement for providing a periodic saw-tooth current in a coil, particularly a kinescope deflector coil, composed of a (first) one-way conducting device connecting the coil to a voltage source, and a (second) controllable switching device, with its control electrode connected to a periodic pilot-pulse source which makes the switching device conductive during part of the saw-tooth cycle, connected to a current source through a (first) induction coil, a (first) capacitor being arranged so that it is charged by the source by means of the induction coil when the switching device is not conductive.

According to important features of the invention, the capacitor is connected to the primary winding of a transformer, the secondary winding of the transformer is connected to the one-way conducting device, and the conduction time of the switching device and the discharge time of the capacitor are longer than the return time of the saw-tooth cycle.

Further objects, features and advantages of the inventive circuit arrangement, preferably including a thyristor, will become better understood by reference to the following description, when taken in conjunction with the sole FIGURE of the accompanying drawing, showing the circuit diagram of an exemplary, preferred arrangement according to the invention.

Before describing the circuit arrangement, reference should be had to a concurrently filed patent application Ser. No. 770,114 of the undersigned, with an identical title, which relates to a similar but not identical circuit arrangement that provides a periodic saw-tooth current, for example for a kinescope deflector coil. Almost exclusively identical reference numerals have been used in the two closely related applications, to cover identical circuit elements of those having similar functions, except where additional elements are involved that are not part of the other circuit arrangement.

Numerals 1, 2 in the FIGURE indicate the respective positive and negative supply terminals of a DC source obtainable by using any of the known methods, for example, by rectifying and filtering the domestic AC mains supply.

Between the terminals 1, 2 are connected in series: an autotransformer 3 having an induction winding and an intermediate tap $3a$; a capacitor 20; and a diode 21 with its anode connected to the terminal 2. In this description, the electronic elements are described in the sequence of their logical presentation in the circuit, but not strictly in numerical order, so as to be able to keep the correlation of the Ref. Nos. with those of the other application.

Between capacitor 20 and diode 21 is connected the anode of a second diode 22 the cathode of which is connected to an output terminal 23.

Between the terminals 1, 2 is connected a second series circuit comprised a diode 8 the cathode of which is connected to the terminal 1; and the secondary winding of a transformer 13 which has two intermediate taps $13a$, $13b$, the secondary which has these taps therein being linked to diode 8 at a point $13c$ while the other end of the secondary goes to the terminal 2. By way of comparison it might be added at this point that the function of induction coil 9 of the above-mentioned related application is taken over in the presently described circuit arrangement by leakage inductance in transformer 13.

A capacitor 15 is connected parallel to the secondary winding. Between tap $13a$ and the negative terminal 2, there is a series circuit composed of a capacitor 12 and a deflector coil (that of a kinescope), including preferably two parallel-connected coil portions $11a$, $11b$, as shown.

Between tap $13b$ and the terminal 2 there is a series circuit composed of a diode 14 and a capacitor 16 (preferably electrolytic). A comparatively low continuous voltage for supplying auxiliary circuits can be derived from the junction of diode 14 and capacitor 16, connected to another output terminal 17, in conjunction with the terminal 2 (ground).

A capacitor 10 is connected between tap $3a$ of autotransformer 3 and the negative terminal 2. To the same tap $3a$ is also connected a terminal of the primary winding of transformer 13. The other terminal thereof is connected to the anode of a thyristor 4 or the like controllable electronic switching device, which can also be in the form of a SCR (silicon-controlled rectifier) having a control electrode 5, with its cathode connected to the negative terminal 2. An extraneous periodic pilot-pulse source can be used, as described in the above-mentioned other application.

Connected parallel to thyristor 4 is a parasitic oscillation damping unit including a resistor 6 and a capacitor 7.

The circuit in question operates as follows. The instant the control electrode 5 of thyristor 4 receives a firing pulse (a repetitive line-frequency pulse obtained from the synchronization pulses received), capacitor 10 which had been charged, by means of the primary inductance of autotransformer 3, at roughly three times the supply voltage (the time constant $2\pi\sqrt{LC}$ of that inductance and capacitor 10 being equal to roughly 75 microseconds, with the figures to be shown later for the electrical elements, that is, roughly equal to twice the charging time, as we shall see later on) discharges through the primary of transformer 13 and thyristor 4 which has been made conductive.

The discharge current is oscillatory. The laws governing discharge are determined, in addition to capacitor 10, by the leakage inductance of transformer 13, connected in series to capacitor 10, by the inductance of coils 11a, 11b and by capacitor 15 on the primary winding.

The discharge current reaches a maximum after about 7 microseconds after which it begins to drop. At a certain point, the voltage of the terminals of capacitor 15, which had reached a maximum negative point roughly at the same time the thyristor current was at a maximum, after which it had moved up rapidly, gradually exceeds the supply voltage.

At this point (roughly 13 microseconds from the start of the cycle) diode 8 becomes conductive (end of the retrace interval and beginning of the trace interval of the saw-tooth cycle) so that we find the supply voltage applied to the terminals of the secondary winding of transformer 13. This constant voltage in the transformation ratio is applied to coils 11a, 11b in which there now flows a gradually decreasing current.

Thyristor 4 continues to conduct even after diode 8 has become conductive as capacitor 10 has not yet been discharged. In fact, the current in thyristor 4 tends to increase after which it starts to drop again to zero, roughly 24 microseconds after the start of the cycle (the conditions governing discharge have now been changed; connected in series to capacitor 10 there is only the leakage inductance of the primary winding of transformer 13, the secondary of which is now short-circuited through diode 18 and the power unit).

At this point, the voltage at the terminals of thyristor 4 is inverted so that the thyristor is disabled and capacitor 10 begins recharging through the primary of autotransformer 3. As you can see, charging takes roughly 64 − 24 = 40 microseconds. In the meantime, diode 8 remains conductive until all the power transmitted to coils 11a, 11b by capacitor 10 discharging has been returned to the power unit.

By suitably dimensioning the circuit (capacitor 10, inductance of the primary winding of autotransformer 3, and primary/secondary ratio of transformer 13) this power can be made sufficient to keep diode 8 conductive until thyristor 4 is fired again, 64 microseconds after the start of the cycle. The process is then repeated.

The ratio between the leakage inductance of the primary winding of transformer 13 and the inductance of coils 11a, 11b referred to the primary side, and the ratio between the capacitor 15 referred to the primary side and to capacitor 10 are very important as they determine the return time, the conduction time of thyristor 4, and the shape of the discharge current.

Experiments have shown that the ratio of the two inductances mentioned should be in the order of unity, and the ratio of the two capacities in the order of 0.5. Various other factors should also be taken into account in practice: namely the maximum voltage the thyristor 4 can withstand, the maximum current, etc.

Both articles mentioned previously suggest that the circuit should be dimensioned so that the conduction time of thyristor 4 is equal to the non-conduction time of the diode 8. In practice, however, it has been found more advisable for the thyristor 4 to conduct as long as possible to reduce the required current peak. Conduction time, however, cannot be increased beyond certain limits as, the more conduction time is increased, the more the ratio between the supply voltage and the maximum thyristor voltage is increased. Each supply voltage, therefore, has an optimum conduction time. The function of capacitor 12 is to prevent DC current from being sent to coils 11a, 11b and to perform the necessary S correction of the deflection current.

The function of diode 14 is to supply low-voltage auxiliary circuits (25 V), for example, vertical and audio, etc. Considerable power can be picked up by diode 14 without interfering with the operation of the circuit as the current picked up is taken from that of diode 8. In other words, the power is sent to supply the auxiliary circuits through diode 14 instead of being sent back to the power unit through diode 8. The withdrawal of a certain amount of power by diode 14 is even advisable to improve deflection linearilty and reduce the losses of transformer 13.

The extra-high voltage for the kinescope is provided by the circuit composed of elements 20 ... 22 together with autotransformer 3.

The autotransformer increases the more or less sinusoidal voltage present at the terminals of capacitor 10 to the required level. This alternating voltage is then subjected to peak-to-peak rectification by diodes 21, 22 and made available at the terminal 23.

Tuning is not necessary. With the two windings of autotransformer 3 being coaxial, the coupling coefficient is good and parasitic oscillations are maximum. In any case, they have no effect whatsover on the deflection current in that the deflection and extra-high voltage circuits are coupled only to a small extent. With an almost sinusoidal alternating voltage of 15 kHz, the losses are also minimum as is the current peak in the diode (larger circulating angle).

This solution also overcomes the necessity for harmonic tuning which, given the inevitable tolerances of mass production, gives rise to considerable dispersion of the extra-high voltage available.

In the following, the values of the various electronic components are indicated that have been used successfully in an experimental version of the described circuit arrangement:

| Thyristor | 4 | TR 40889 (Italy) |
|---|---|---|
| Resistor | 6 | 1 kΩ |
| Capacitor | 7 | 1 nF |
| " | 10 | 75 nF 1 kV |

| -continued | | |
|---|---|---|
| Deflector semi-coils | 11a, 11b | 4 mH each |
| Capacitor | 12 | 0.33 μF |
| Diode | 14 | BA 157 (Italy) |
| Capacitor | 15 | 2200 pF 2 kV |
| "(e'lytic) | 16 | 220 μF 40 V |
| " | 20 | 500 pF 10 kV |
| Diodes | 21, 22 | MR 18 (Italy) |

Autotransformer 3 has an inductance of 1.9 mH between the input terminal 1 and tap 3a, and an upward transformation ratio of 22 : 1 between tap 3a and the output. The two sections of the winding (input and output taps) are wound coxially one on top of the other. Transformer 13 has a primary no-load inductance of 2.9 mH and a no-load primary/secondary upward transformation ratio of 1 : 3.6. Tap 13a is situated at 0.5 of the whole, that is, halfway along the secondary winding, and tap 13b at one-seventh.

Transformer 13 is wound about a core composed of two ferrite C's. Three-fifths of the primary are wound on one branch and the remaining two-fifths on the opposite one. The secondary is wound entirely on the second branch, on top of the second primary section.

By means of this arrangement, a primary inductance of 0.48 mH was obtained with the secondary short-circuited. Supply voltage is roughly 205 V.

The advantages of the circuit arrangement according to this invention will be clearly seen and understood from the description. To those skilled in the art, it will be clear that variations, substitutions, modifications and changes can be made to the described circuit without, however, departing from the spirit and scope of the present invention.

It should also be understood that the concurrently filed application of the same inventor, mentioned at the beginning of the detailed description, should be considered as supplementing the present disclosure, if necessary in respect of some detail, possibly not expounded or fully explained in the present case (with different words) as in the other, companion application.

What I claim is:

1. A circuit arrangement for providing a periodic saw-tooth current in a coil, such as a kinescope deflector coil (11a, 11b) comprising:
   a one-way conducting device (8) having one end immediately coupled to a pole (1) of a voltage source (1, 2) and the other end coupled to the coil;
   a thyristor (4) having one terminal connected to the other pole (2) of said voltage source and having a control electrode (5) which may be coupled to an extraneous periodic pilot-pulse source which makes said thyristor conductive at the end of the trace interval of the saw-tooth cycle;
   an autotransformer (3) having one end connected to said one pole (1) of the said voltage source (1.2), an intermediate tap (3a) connected to the other terminal of said thyristor (4), and the other end connected to a rectifier (22) to provide a high D.C. voltage output for the acceleration electrode of the kinescope;
   a capacitor (10) having one end connected to said intermediate tap (3a) of said autotransformer (3) and to said other terminal of said thyristor, and the other end connected to said other pole (2) of said voltage source (1.2);
   a transformer (13) having a primary winding, connecting said intermediate tap (3a) of said autotransformer (3) to said other terminal of said thyristor (4), and a secondary winding connecting said other end of said one-way conductive device (8) to said other pole (2) of said voltage source (1.2);
   wherein said transformer is sized to have a primary inductance with the secondary short-circuited which, together with said capacitor (10) forms a time constant sufficiently great to keep the thyristor conductive throughout all the retrace interval and for the first part of the trace interval of the saw-tooth cycle.

2. The circuit arrangement as defined in claim 1 further comprising a capacitor (20) and a second rectifier (21) to form with said rectifier (22) a peak-to-peak rectifier.

3. The circuit arrangement as defined in claim 1, wherein the coupling between the two parts of said autotransformer (3) has a coefficient that is close to unity.

* * * * *